United States Patent [19]

Oho et al.

[11] Patent Number: 4,835,595
[45] Date of Patent: May 30, 1989

[54] OPTICAL INTERCONNECTIONS FOR INTEGRATED CIRCUITS

[75] Inventors: Shigeru Oho; Kazuji Yamada, both of Hitachi; Shigeki Tsuchitani, Mito, all of Japan

[73] Assignee: Hitachi, Ltd., Tokyo, Japan

[21] Appl. No.: 100,742

[22] Filed: Sep. 24, 1987

[30] Foreign Application Priority Data

Sep. 25, 1986 [JP] Japan ................... 61-224907

[51] Int. Cl.[4] ............ H01L 27/14; H01L 31/00; H01L 40/14; H01L 25/00
[52] U.S. Cl. ............... 357/30 R; 357/30 G; 357/30 FO; 357/30 M; 250/211 J; 250/370.08; 250/370.14; 250/332
[58] Field of Search ............ 357/30 G, 30 FO, 30 M, 357/30 R; 250/370.08, 370.14, 211 J, 332

[56] References Cited

U.S. PATENT DOCUMENTS

| | | | |
|---|---|---|---|
| 4,270,135 | 5/1981 | Schlegel et al. | 357/30 M |
| 4,321,611 | 3/1982 | Conti | 357/30 M |
| 4,513,305 | 4/1985 | Bloss, III et al. | 357/30 M |
| 4,689,652 | 8/1987 | Shimada et al. | 357/30 M |
| 4,703,337 | 10/1987 | Yamazaki | 357/30 R |

FOREIGN PATENT DOCUMENTS

| | | | |
|---|---|---|---|
| D154962 | 9/1985 | European Pat. Off. | 357/30 FO |
| 0017286 | 1/1984 | Japan | 357/30 FO |
| 0153184 | 8/1985 | Japan | 357/30 FO |

OTHER PUBLICATIONS

Goodman et al., "Optical Interconnections for VLSI Systems", Proceedings of the IEEE, vol. 72, No. 7, Jul. 1984, pp. 850–865.

Primary Examiner—Eugene R. LaRoche
Assistant Examiner—Michael B. Shingleton
Attorney, Agent, or Firm—Antonelli, Terry & Wands

[57] ABSTRACT

An optical interconnection in a semiconductor integrated circuit includes an opaque coating provided on a surface of the integrated circuit chip. The opaque coating has therein an opening which is positioned above a light receiving element incorporated in the chip and is filled with a transparent material layer. The transparent layer may have a lens action and/or a wavelength-selectivity.

21 Claims, 3 Drawing Sheets

U.S. Patent    May 30, 1989    Sheet 1 of 3    4,835,595
FIG. I
PRIOR ART
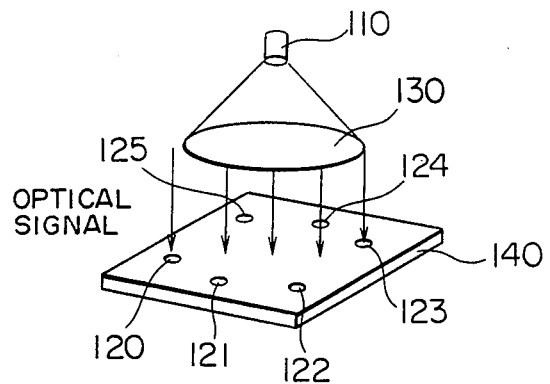
FIG. 2
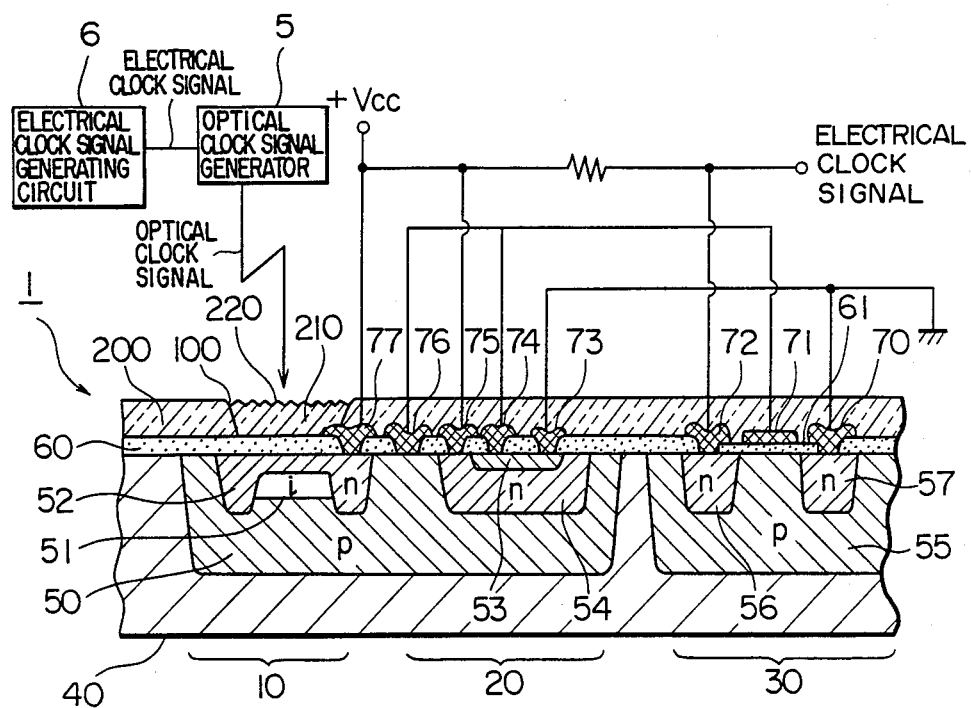

4,835,595

OPTICAL INTERCONNECTIONS FOR INTEGRATED CIRCUITS

BACKGROUND OF THE INVENTION

The present invention relates to interconnections for semiconductor integrated circuits, and more particularly to optical interconnections which cause a multiplicity of elements in semiconductor integrated circuits to be activated or operated.

In the hitherto known semiconductor integrated circuits, wirings or interconnections for transferring clocks, timing signals or the like are realized by diffused resistive layers, metal layers (made of, for example, aluminum) or the like formed on a semiconductor chip. With such electrical interconnections, however, delays of signal transfer take place due to electrostatic capacitances associated with the electrical interconnections, thereby resulting in a hindrance to improvement in the operation speed of an integrated circuit.

In order to solve such a problem, an optical interconnection system using light for signal transfer has been proposed, as disclosed by, for example, J. W. Goodman et al, "Optical Interconnections for VLSI Systems", Proc. of the IEEE, Vol. 72, No. 7, pp. 850–866, July 1984. In the optical interconnection system, an optical signal is transferred through the propagation in a free space or via optical fibers or optical waveguides, thereby allowing the signal transfer at a very high speed which is equal to the propagation speed of light in such a medium.

FIG. 1 shows an example of the optical interconnection system, disclosed by the above-mentioned Goodman et al's article, in which light propagating in a free space is used. Referring to the figure, light as an optical signal emitted from a light source 110 is collimated by a lens 130 to irradiate a semiconductor integrated circuit chip 140. Light receiving elements 120 to 125 formed in the integrated circuit chip 140 receive the optical signals to convert them into electrical signals. If such optical signals are clock signals for logic circuits formed in the integrated circuit chip, the timings of electric clock signals reproduced or regenerated at any points on the chip would completely coincide with each other. This provides an advantage that the occurrence of a timing jitter resulting from the propagation delays which may take place in the case of electrical interconnections can be prevented.

In the above described conventional example of the optical interconnection system, however, since the entire upper surfaces of the semiconductor integrated circuit is uniformly irradiated, some photoelectrons are generated by optical excitation in the whole integrated circuit including the light receiving elements. Such generated photoelectrons can have an adverse influence, large and small, on the characteristics of transistors or diodes included in the integrated circuit, resulting in inferior operating characteristics of the integrated circuit and/or erroneous operation thereof.

As to the light illuminating the upper surface of the semiconductor integrated circuit, the effective light portion or a light portion incident on the light receiving elements 120 to 125 is extremely small since the areas of the light receiving elements are limited because of improvement of the integration degree. Therefore, the efficiency of utilization of light is poor.

Further, the above-described conventional example of the optical interconnection system assumes simultaneous activation of all the light receiving elements. Namely, no consideration is given with respect to selective activation of the light receiving elements.

SUMMARY OF THE INVENTION

An object of the present invention is to provide an optical interconnection in a semiconductor integrated circuit in which a reduction in the quality in the quality of the characteristics of the integrated circuit and/or an erroneous operation thereof do not take place.

Another object of the present invention is to provide an optical interconnection in a semiconductor integrated circuit in which the efficiency of utilization of light is improved.

A further object of the present invention is to provide an optical interconnection in a semiconductor integrated circuit in which light receiving elements can be selectively activated by use of simple means.

A still further object of the present invention is to provide an optical interconnection in a semiconductor integrated circuit in which the efficiency of utilization of light is improved and light receiving elements can be selectively activated by use of simple means.

To that end, in the present invention, a portion of the surface of the semiconductor integrated circuit excepting the upper surface of a light receiving element is coated with an opaque layer while the upper surface of the light receiving element is provided with a transparent layer. The transparent layer may be provided with a lens function to effectively utilize incident light. The transparent layer may have selectivity to wavelengths of light to selectively activate a plurality of light receiving elements. In that case, an optical pulse signal irradiating the light receiving elements has a plurality of corresponding wavelengths.

BRIEF DESCRIPTION OF THE DRAWINGS

FIG. 1 is a perspective view of an example of the conventional optical interconnection in a semiconductor integrated circuit;

FIG. 2 shows an embodiment of the present invention with respect to one light receiving element or photoelectric conversion element;

DESCRIPTION OF THE PREFERRED EMBODIMENTS

Figure 3:
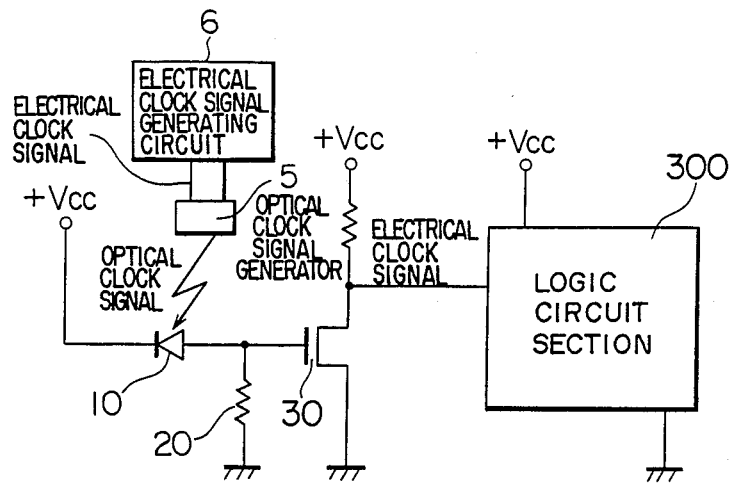
FIG. 3 shows an equivalent circuit of the embodiment shown in FIG. 2.

An optical interconnection in a semiconductor integrated circuit of the present invention will now be described in detail by virtue of embodiments shown in the accompanying drawings.

An embodiment of the present invention is shown in FIG. 2 which is a cross section of a part of a semiconductor IC (integrated circuit) embodying the present invention. In FIG. 2, a reference numeral 1 generally designates a semiconductor IC chip. The chip 1 is fabricated by forming buried layers 50 and 55 of p-type conductivity in a semiconductor substrate (silicon) 40 of n-type conductivity and thereafter forming a photodiode 10, a resistor 20 and a transistor 30 in the buried lyers. The photodiode 10 is a p-i-n photodiode which includes an n-type layer 52, an intrinsic layer 51 and the p-type layer 50. A p-type layer 53 is a diffused resistor which forms the resistor 20 (see FIG. 3) together with an n-type layer 54. The transistor 30 is an N-channel MOS transistor which includes n-type source and drain layers 57 and 56 formed in the p-type buried layer 55, a gate insulating film 61, and a gate electrode 71. Reference numeral 60 designates a field oxide film, and numerals 70 and 72 to 77 designate contacts for wiring. Though for better understanding the wiring is shown in FIG. 2 in a form drawn out to the exterior, the wiring is actually provided by printed wiring or interconnections disposed on the field oxide film 60.

The chip 1 thus prepared is coated with an opaque insulating resin layer 200. More especially, the opaque resin layer 200 is formed by applying a mixture of silicone rubber, polyimide or epoxy with titanic white (titanium oxide), bengara or carbon in a form of thin film on the IC chip 1 by means of a spinner. Next, an opening 100 is provided in the opaque resin layer. The opening 100 is positioned just above the photodiode 10 and its size is larger than a working or operating area of the photodiode. The opening 100 may be formed by masking the opaque resin layer excepting a portion thereof where the opening is to be provided and then etching the exposed portion.

Thereafter, a filling material 210 made of a transparent resin is provided in the opening 100. The transparent resin layer 210 may be formed by applying silicone rubber, polyimide or epoxy into the opening 100 and onto the upper surface of the opaque resin layer by means of a spinner and etching away the resulting structure by a predetermined thickness. Next, a Fresnel lens 220 is formed on the surface of the filling material 210 by pressing. The lens 220 has a function of converging or collecting light incident from the opening larger than the working area of the photodiode into the working area of the photodiode. A spherical lens, a refractive index-distributed lens or the like may be used in place of the Fresnel lens. The transparent layer 210 may be a glass layer formed by sputtering. The thickness of each of the opaque layer 200 and the transparent layer 210 may be 2 to 3 microns.

In FIG. 2, a reference numeral 6 designates an electrical clock signal generating circuit for generating an electrical clock signal, and numeral 5 designates an optical clock signal generator means for generating an optical clock signal in response to the electrical clock signal. The optical clock signal is delivered in the form of a change in strength of light, the form of ON/OFF of light, or the like and is ultimately used as an electrical signal for operating a logic circuit section 300 (see FIG. 3). Although the clock signal generating circuit 6 is illustrated by way of example, other signals may be used with like meritorious effects. That is, the signal generating circuit 6 may be a pulse generator means for generating an electrical pulse signal. By converting the electrical pulse into an optical pulse signal the present invention is applicable to advantages.

Next, the operation of the embodiment shown in FIG. 2 will be explained referring to FIG. 3 which illustrates an equivalent circuit of the structure shown in FIG. 2. The optical clock signal emitted from the optical clock signal generator 5 irradiates the photodiode 10 on the IC chip 1. At this time, the light incident onto the photodiode passes through the transparent layer provided in the opening 100 and is converged by a lens action of the transparent layer to irradiate the working area of the photodiode 10. By irradiation with the light, the photodiode 10 becomes conductive so that a current from a power source $+V_{CC}$ (e.g. 5 V) flows through the resistor 20 (e.g. 1 KΩ) across which a voltage is developed. This voltage is amplified by the MOS transistor 30 and is supplied as an electrical clock signal to the logic circuit section 300. Alternatively, in the case where the signal generating circuit 6 is formed of a usual pulse generator but not a clock signal generator explained with reference to FIG. 2, an electrical pulse signal generated by the pulse generator 6 is converted into an optical pulse signal by the circuit 5. The photodiode 10 is driven by the optical pulse signal.

Figure 4:
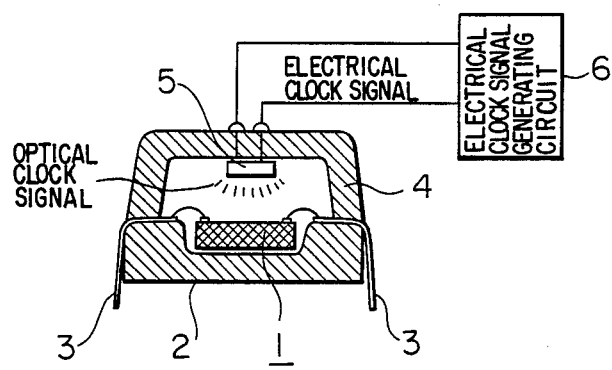
FIG. 4 is a general illustration of the embodiment of the present invention.

Though the above explanation has been made in conjunction with a single logic element which includes one photodiode 10, one resistor 20 and one MOS transistor 30, a multiplicity of such logic elements are actually formed in the IC chip. In the present embodiment, the multiplicity of logic elements are simultaneously activated by a single optical clock signal generating means. This situation is illustrated in FIG. 4. Referring to FIG. 4, the IC chip 1 includes the multiplicity of logic circuits. Reference numeral 2 represents a lower mold, numeral 3 lead terminals, and numeral 4 an upper mold. Inside the upper mold 4 is mounted the optical clock signal generator 5 such as a light emitting diode for receiving an electrical clock signal from the electrical clock signal generating circuit 6 to generate an optical clock signal. The optical signal or light emitted from the light emitting diode 5 irradiates the whole of the chip 1. Accordingly, the photodiodes on the chip 1 are all activated concurrently by one clock signal. As a result, the timings of activation of all the photodiodes coincide with each other so that any timing jitter due to delays in transfer of clock signals is not exhibited.

It is apparent from FIG. 2 that since those portions of the structure excepting the upper surfaces of the photodiodes are coated with the opaque resin layer 200, the generation of photoelectrons is inhibited except for the sites of the photodiodes, thereby preventing any reduction in the operating characteristics of the integrated circuit and/or erroneous operation thereof.

As has been described, the size of the opening 100 is made larger than the working area of the photodiode, the transparent layer is provided in the opening 100, and the transparent layer has a lens function. Therefore, light incident from the opening which is larger than the working area of the photodiode can be effectively utilized though only light irradiated onto an area corresponding to the working area of the photodiode is otherwise effective. In other words, light from the large opening 100 is converged into the working area of the photodiode by means of the lens provided at the opening, thereby enhancing the efficiency of utilization of incident light.

Though in the foregoing embodiment the light emitting diode (LED) 5 is mounted inside the upper mold 4 so that light emitted from the LED is used as a signal light, a construction may be employed in which a window made of a transparent material such as glass is provided in the upper mold 4 so that a signal light is introduced from the window to irradiate the internal chip 1.

Figure 5:
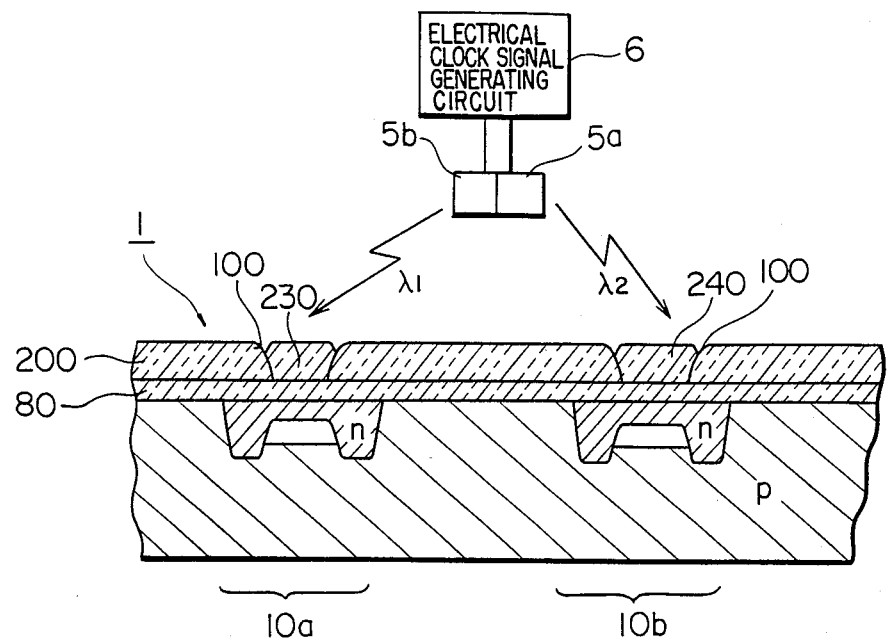
FIG. 5 shows another embodiment of the present invention.

FIG. 5 shows another embodiment of the present invention in which transparent layers provided in the openings 100 have different selectivities to wavelengths of light. More particularly, photodiodes on the IC chip 1 are grouped into a plurality of sets and transparent layers 230 provided in the openings 100 above the photodiodes in one set (only a photodiode 10a is shown) selectively transmit light having a wavelength λ₁ while transparent layers 240 provided in the openings 100 above the photodiodes in another set (only a photodiode 10b is shown) selectively transmit light having a wavelength λ₂. The number of the diode sets can be increased, as required. Reference numeral 80 designates a transparent resin layer.

Optical clock signal generating means provided above the IC chip 1 is divided into two sections 5a and 5b one of which emits the light of wavelength λ₁ and the other of which emits the light of wavelength λ₂. Therefore, by driving the sections 5a and 5b by clock signals having different phases, respectively, the plurality of photodiodes on the IC chip can be driven by multiphase clock signals. The photodiodes belonging to each set are simultaneously activated, like the case of the embodiment shown in FIG. 2, so that no timing jitter takes place. Each of the transparent layers having different wavelength-selectivities can be formed by use of gelatin added with a dye having a predetermined wavelength-selectivity.

Figure 6:
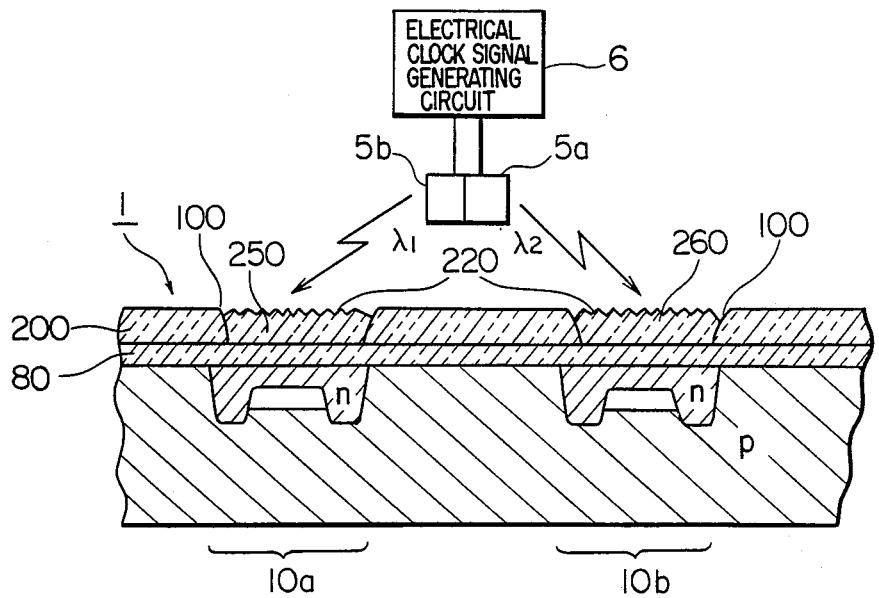
FIG. 6 shows a further embodiment of the present invention.

FIG. 6 shows a further embodiment of the present invention which is similar to the embodiment of FIG. 5 but aims to improve the efficiency of utilization of light. The size of the opening 100 is made larger than the working area of the photodiode. Transparent layers 250 and 260 filled in the openings 100 are provided with different wavelength-selectivities. Each transparent layer is further provided with a lens action by a Fresnel lens 220 or the like. As a result, light incident from the opening larger than the working area of the photodiode is converged into that working area.

The present invention has been disclosed with respect to the specific embodiments, but the invention is not limited to those embodiments.

While the invention has been described in terms of its preferred embodiments, numerous modifications and-/or obvious variations may be made thereto without departing from the spirit and scope of the invention. It is intended that all such modifications and variations fall within the scope of the appended claims.

We claim:

1. An optical interconnection in a semiconductor integrated circuit comprising:
a semiconductor substrate having a main surface;
optical pulse signal generating means, external to said semiconductor substrate, for generating light of different wavelengths toward said main surface of said semiconductor substrate as optical clock signals having different phases corresponding to said different wavelengths in response to electrical clock signals having different phases;
a plurality of sets of photo-electric conversion elements formed in a region of said semiconductor substrate extending to said main surface, said photo-electric conversion elements being activated in response to optical clock signals generated from signal optical clock signal generating means;
other electrical circuit devices formed in said semiconductor substrate;
an opague layer covering said main surface of said semiconductor substrate, said opague layer having therein respective openings disposed above each one of said photo-electric conversion elements; and
transparent layers being respectively provided in said openings, said transparent layers being grouped into a plurality of sets corresponding in number to the number of said plurality of sets of photo-electric conversion elements, respectively, each of said plurality of sets of transparent layers having a wavelength-selectivity corresponding to one of the lights of the different wavelengths so that all the photo-electric conversion elements in each associated set are simultaneously activated in response to a light having the same corresponding wavelength.

2. An optical interconnection in a semiconductor integrated circuit comprising:
a semiconductor substrate having a main surface;
optical pulse signal generating means, external to said semiconductor substrate, for generating lights of different wavelengths toward said main surface of said semiconductor substrate as optical pulse signals having different phases corresponding to said different wavelengths in response to electrical clock signals having said different phases;
a plurality of sets of photo-electric conversion elements formed in a region of said semiconductor substrate extending to said main surface, said photo-electric conversion elements being activated in response to optical clock signals generated from said optical clock signal generating means;
other electric circuit devices formed in said semiconductor substrate;
an opague layer disposed to cover said main surface of said semiconductor substrate, said opague layer having therein respective openings disposed above each one of said photo-electric conversion elements; and
transparent layers being respectively provided in said openings, each of said transparent layers having a lens action so as to converge incident light through the corresponding opening into the working area of the associated photo-electric conversion element, said transparent layers being grouped into a plurality of sets corresponding in number to the number of said plurality of sets of photo-electric conversion elements, respectively, each of said plurality of sets of transparent layers having a wavelength-selectivity corresponding to one of the lights of the different wavelengths so that all the photo-electric conversion elements in each associated set are simultaneously activated in response to a light having the same corresponding wavelength.

3. An optical interconnection in a semiconductor integrated circuit according to claim 2, wherein each of said openings has a size greater than a working area of an associated photo-electric conversion element.

4. An optical interconnection in a semiconductor integrated circuit according to claim 3, wherein at least one of said photo-electric conversion elements comprises a photodiode.

5. An optical interconnection in a semiconductor integrated circuit according to claim 4, wherein said photodiode is a P-I-N photodiode.

6. An optical interconnection in a semiconductor integrated circuit according to claim 3, wherein each of said transparent layers is provided with a lens for effecting said lens action, said lens being fixedly disposed over said transparent layer.

7. An optical interconnection in a semiconductor integrated circuit according to claim 2, wherein at least one of said photo-electric conversion elements comprises a P-I-N photodiode, 8. An optical interconnection in a semiconductor integrated circuit according to claim 2, further comprising a transparent resin layer disposed between said main surface of said semiconductor substrate and said opague layer.

9. An optical interconnection in a semiconductor integrated circuit according to claim 1, wherein at least one of said photo-electric conversion elements comprises a photodiode.

10. An optical interconnection in a semiconductor integrated circuit according to claim 9, wherein said photodiode is a P-I-N photodiode.

11. An optical interconnection in a semiconductor integrated circuit according to claim 1, further comprising a transparent resin layer disposed between said main surface of said semiconductor substrate and said opague layer.

12. an optical interconnection in a semiconductor integrated circuit according to claim 1, wherein at least one of said other electrical circuit devices comprises an amplifying means having an input coupled to a repsective photo-electric conversion element for producing an internal electrical phase clock signal in response to the activation of said photo-electric conversion element by an optical phase clock signal.

13. An optical interconnection in a semiconductor integrated circuit according to claim 12, wherein said amplifying means is a transistor amplifier.

14. An optical interconnection in a semiconductor integrated circuit according to claim 13, wherein said transistor amplifier comprises a MOS transistor having a gate electrode coupled to said photo-electric conversion element, a drain electrode, coupled to a voltage source through a load, for producing said internal electrical phase clock signal for controlling a circuit section formed in said semiconductor substrate and a source electrode coupled to a reference ground, said amplifier further including a resistance element coupled between said gate electrode and said reference ground and wherein said respective photo-electric conversion element and said resistance element are series-connected between said voltage source and said reference ground.

15. An optical interconnection in a semiconductor integrated circuit according to claim 14, wherein said respective photo-electric conversion element comprises a photodiode.

16. An optical interconnection in a semiconductor integrated circuit according to claim 15, wherein said photodiode is a P-I-N photodiode.

17. An optical interconnection in a semiconductor integrated circuit according to claim 2, wherein at least one of said other electrical circuit devices comprises an amplifying means having an input coupled to a respective photo-electric conversion element for producing an internal electrical phase clock signal in response to the activation of said photo-electric conversion element by an optical phase clock signal.

18. An optical interconnection in a semiconductor integrated circuit according to claim 17, wherein said amplifying means is a transistor amplifier.

19. An optical interconnection in a semiconductor integrated circuit according to claim 18, wherein said transistor amplifier comprises a MOS transistor having a gate electrode coupled to said photo-eletric conversion element, a drain electrode, coupled to a voltage source through a load, for producing said internal electrical clock signal for controlling a circuit section formed in said semiconductor substrate and a source electrode coupled to a reference ground, said amplifier further including a resistance element coupled between said gate electrode and said reference ground and wherein said respective photo-electric conversion element and said resistance element are series-connected between said voltage source and said reference ground.

20. An optical interconnection in a semiconductor integrated circuit according to claim 19, wherein said respective photo-electric conversion element comprises a photodiode.

21. An optical interconnection in a semiconductor integrated circuit according to claim 20, wherein said photodiode is a P-I-N photodiode.

* * * * *